United States Patent [19]
Shirley

[11] Patent Number: 4,815,559

[45] Date of Patent: Mar. 28, 1989

[54] PORTABLE LOUDSPEAKER APPARATUS FOR USE IN LIVE PERFORMANCES

[76] Inventor: Manuel Shirley, 6704 Nagel Ave., Van Nuys, Calif. 91405

[21] Appl. No.: 141,326

[22] Filed: Jan. 6, 1988

[51] Int. Cl.[4] .............................................. H05K 5/00

[52] U.S. Cl. .................................... 181/144; 181/145; 181/153; 181/154; 181/199; 381/90

[58] Field of Search ............... 181/144, 145, 147, 148, 181/153, 154, 199; 381/88–90

[56] References Cited

U.S. PATENT DOCUMENTS

| | | | |
|---|---|---|---|
| 3,627,948 | 12/1971 | Nichols | 181/154 X |
| 3,754,618 | 8/1973 | Sasaki | 181/145 |
| 4,165,797 | 8/1979 | Spetalnik | 181/147 |
| 4,179,008 | 12/1979 | Letourneau | 181/145 X |
| 4,365,688 | 12/1982 | Blose | 181/145 |
| 4,580,654 | 4/1986 | Hale | 181/153 X |

*Primary Examiner*—B. R. Fuller
*Attorney, Agent, or Firm*—Gene W. Arant

[57] ABSTRACT

A portable modular loudspeaker apparatus consists of a cabinet containing at least two speakers pointing in different directions so that sound generation patterns of the different speakers tend to diverge. The cabinet is narrower at the back than at the front, and placing two of the cabinets in a side-by-side abutting relationship provides an array of speakers positioned in a generally arcuate pattern. Each cabinet is provided with manual gripping means on a exterior surface to facilitate transport and installation.

11 Claims, 3 Drawing Sheets

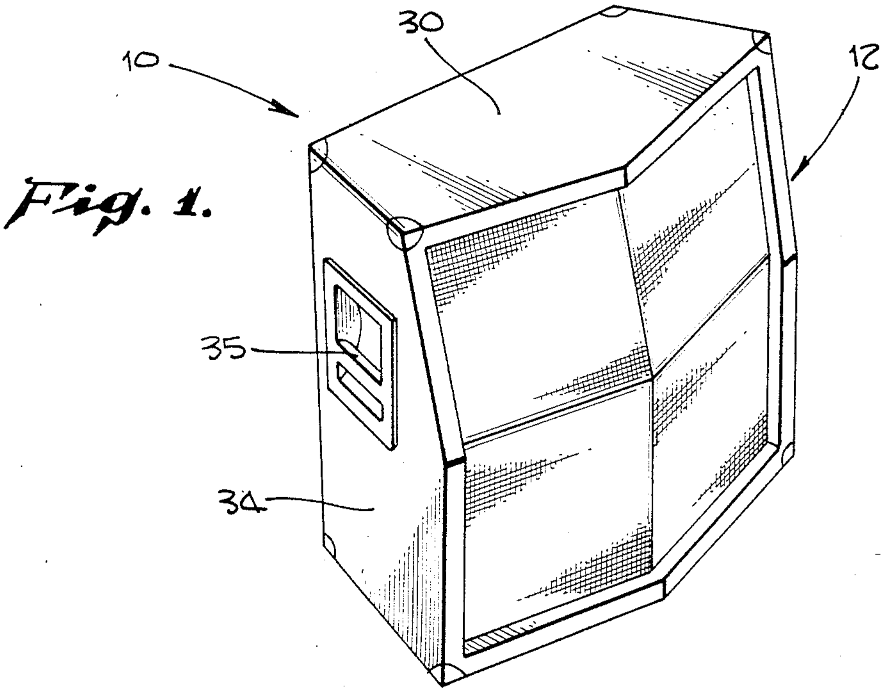
Fig. 1.
Fig. 2.
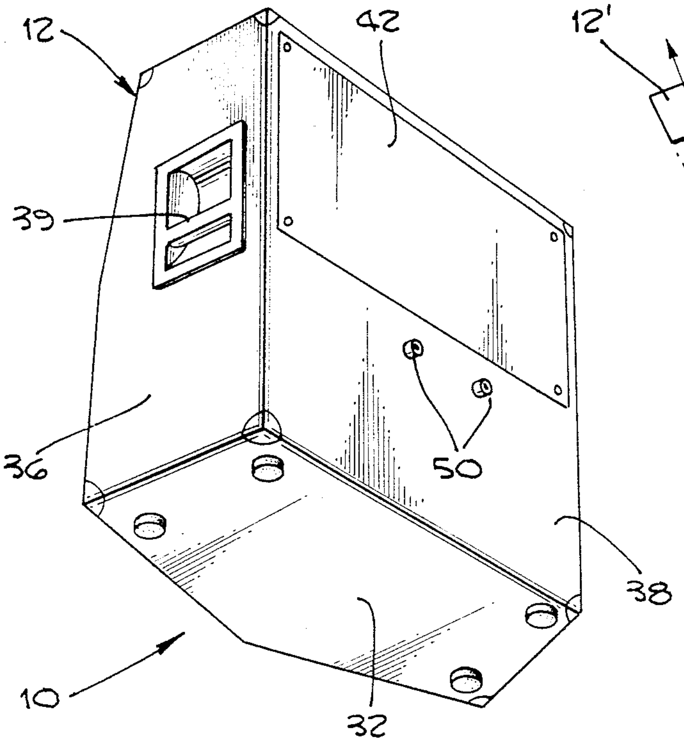
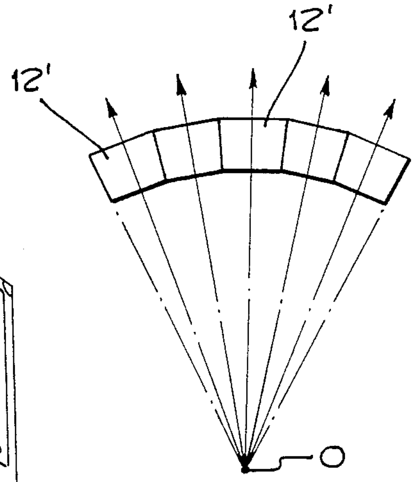
Fig. 9.

PORTABLE LOUDSPEAKER APPARATUS FOR USE IN LIVE PERFORMANCES

BACKGROUND OF THE INVENTION

Major auditoriums are generally equipped with built-in sound systems which are suitable for live performances of music as well as for other types of programs. In such a system there are a fixed number of loudspeakers at fixed locations. Depending upon the particular type of program, certain microphones may be relocated or turned off during some portions of the program. Sound levels are typically controlled through a volume control console that is operated by a sound engineer while the program is in progress. A sophisticated sound console will permit adjusting the input volumes that are accepted from the various microphones, and hence controlling the balance between them. In addition to controlling volume levels and balance, there may also be a provision for adjusting the amplification of the sound in various portions of the frequency spectrum. The control console may also provide for adjustment of the sound volumes that are being supplied to the various loudspeakers. It would be unusual, however, to adjust the respective directions in which the various loudspeakers are pointed, since the directional nature of the composite output pattern of the entire set of speakers is usually specifically designed to conform to the size, shape, and other acoustic characteristics of the particular auditorium.

For any performances which occur inside a building, the acoustical characteristics of the building such as echo and reverberation time must be considered. Any substantial amount of echo is undesirable because listeners hear the echoed sound out of phase with the original sound that is being received direct from the source. Reverberation time is also a factor—reverberation time being a measure of the time required for sound to fade away after the source of sound (loudspeakers) has been turned off. Both echo and reverberation time are diminished when an audience is present in the building, because clothing has the capacity to absorb sound rather quickly, and the clothing of a large number of people can absorb a great deal of sound.

When a live performance is presented in an out-of-doors environment, different considerations apply. Echo tends to be minimal. And reverberation time tends to be small, because there are no walls to restrain the sound. The sound therefore tends to flow endlessly outwardly like radio waves being transmitted into space. It then becomes of even greater importance that loudspeakers are properly placed and properly pointed so that the originally delivered sound reaches all the listeners with appropriate amplitude or volume, and free of phase differences which create conflicting sounds.

FIELD OF THE INVENTION

The present invention relates to portable loudspeakers which are sometimes used inside of a building and are sometimes used outside of a building.

Musical performers, such as bands and guitarists or other instrumentalists, are often confronted with a need to carry their own sound system with them to the location where they will perform. The equipment may be quite bulky, including electric cords, amplifiers, power supply devices providing direct current for energizing the amplifiers, microphones, a sound control console, and loudspeakers. All of this equipment must then be positioned and interconnected in an appropriate manner.

SUMMARY OF THE INVENTION

The present invention provides portable loudspeaker apparatus which is convenient to transport and to install, and which simplifies the task of obtaining an acoustically correct installation.

A speaker cabinet is provided which contains two or more speakers in fixed locations inside the cabinet, and which are pointed in somewhat different directions. The sound generation pattern of each speaker then overlaps somewhat the sound generation pattern of an adjacent speaker, but as the sound travels away from the location of the speaker cabinet the sound output of each individual speaker tends to diverge away from the sound output of the adjacent speaker.

Further, the exterior side walls of each speaker cabinet are tapered in the horizontal plane, being narrower at the back than at the front. Each speaker cabinet is preferably equipped with recessed carrying handles in its exterior side walls. Two or more of such speaker cabinets may be placed in side-to-side, mutually engaged relationship, and will then provide an array of speakers each of which is correctly pointed. More specifically, in such an array, the individual speakers are positioned in a generally arcuate pattern.

In the presently preferred form of the invention a single speaker cabinet contains four speakers, two of which are aligned horizontally in a lower layer, and the other two of which are aligned horizontally in an upper layer; the speakers in the upper layer being also vertically aligned above the respective speakers in the lower layer. The speakers in the lower layer of speakers are pointed in a generally horizontal direction, and those two speakers are also pointed in somewhat different directions in the horizontal plane so that their output sounds follow diverging paths. The speakers in the upper layer of speakers are pointed in a somewhat upwardly inclined direction at an angle of a few degrees above the horizontal, and in a horizontal plane those two speakers are also pointed in diverging directions like the lower speakers.

DRAWING SUMMARY

Reference is now made to the drawings in which:

FIG. 1 is a perspective view of the presently preferred form of speaker cabinet in accordance with my invention, as seen from the upper left front corner;

FIG. 2 is a perspective view of the presently preferred form of speaker cabinet in accordance with my invention, as seen from the lower right rear corner;

FIG. 9 is a top plan view of the generalized form of a speaker array according to the invention.

DESCRIPTION OF PREFERRED EMBODIMENT

Figure 3:
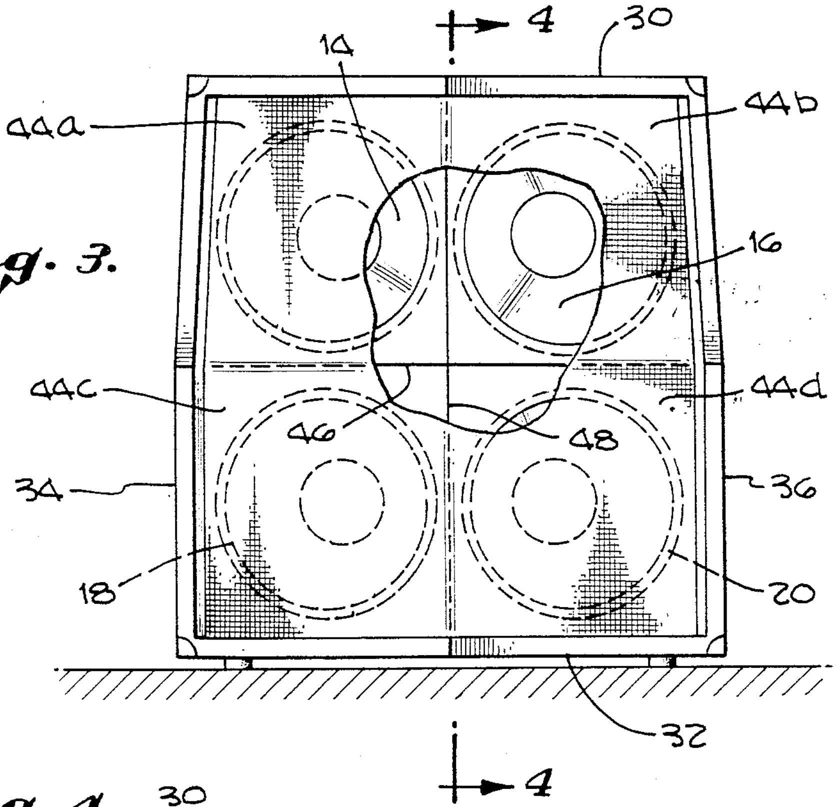
FIG. 3 is a front elevation view of the speaker cabinet showing the locations of the individual speakers in dotted lines.

Reference is now made to the drawings, FIGS. 1 through 6, inclusive, and 8, which illustrate the presently preferred embodiment of the invention.

A single apparatus 10 in accordance with the invention includes a speaker cabinet 12, upper speakers 14 and 16, lower speakers 18 and 20, a front sound baffle 22, and electrical connections for the speakers. The wooden cabinet 12 will first be described in some detail.

Cabinet 12 as best seen in FIGS. 1, 2, 4 and 6 has flat top and bottom walls 30, 32 which are somewhat rectangular but depart significantly from a true rectangular shape. The vertically extending left side wall 34 is seen in FIG. 1 while the vertically extending right side wall 36 is seen in FIG. 2. Back wall 38 seen in FIGS. 2, 4 & 6 has its upper central portion cut away to provide an opening 40. A removable panel 42, FIG. 2, preferably made of wood, normally covers that opening. A front wall 44 which fills the horizontal space between the side walls (FIGS. 1 and 6) and the vertical space between the top and bottom walls (FIGS. 1 and 4) is made of four separate pieces.

Figure 6:
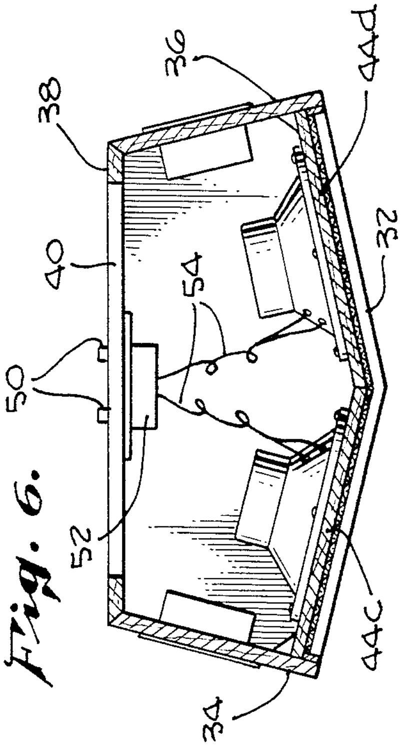
FIG. 6 is a horizontal cross-sectional view taken on the line 6—6 of FIG. 4.

More specifically, the side walls 34, 36 are not perpendicular to the back wall 38, see FIG. 6, but are disposed at an angle of about 100 degrees to the back wall so that they diverge outwardly about 10 degrees on each side of the cabinet. Top wall 30 fits over the side walls while bottom wall 32 fits underneath the side walls. Thus the top and bottom walls each has tapered side edges, being wider at the front than at the rear. The front edge of both the top wall and the bottom wall is tapered to a central apex such that each half of the front edge is disposed perpendicular to the corresponding side wall. See FIGS. 1, 2, and 6. Side walls 34, 36, are provided with externally recessed hand grips 35, 37, respectively, for convenience in carrying the apparatus.

The various sections of front wall 44 are designated *44a*, *44b*, *44c*, and *44d*, respectively. Section *44a* is the upper left section as seen from the front of cabinet 12. Section *44b* is the upper right section. Section *44c* is the lower left section. And section *44d* is the lower right section. Sections *44b* and *44d* are specifically identified in FIG. 4 while sections *44c* and *44d* are specifically identified in FIG. 6. It will be seen that each of these sections in and of itself is flat and generally square in shape.

The interior of cabinet 12 is divided into four separate speaker compartments by means of a horizontal wooden shelf 46 and a vertical wooden divider 48, both of which are shown only schematically by means of lines in FIG. 3. Thus there is a separate speaker compartment behind each of the sections of front wall 44.

Lower sections *44c* and *44d* of the front wall 44 are parallel to the respective front edges of bottom wall 32. Thus, they are not aligned in the same plane, but instead have an included angle between their interior surfaces of about 160 degrees while the included angle between their exterior surfaces is about 200 degrees.

Figure 4:
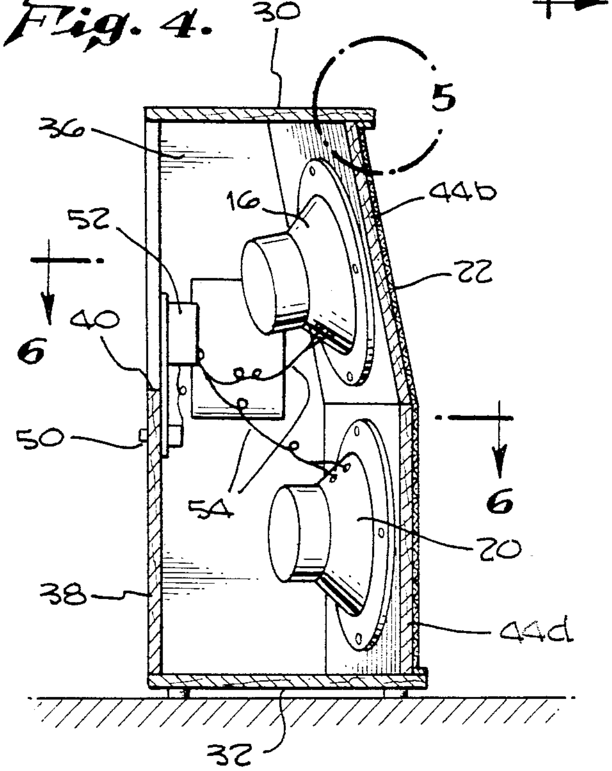
FIG. 4 is a vertical cross-sectional view taken on the line 4—4 of FIG. 3.
Figure 5:
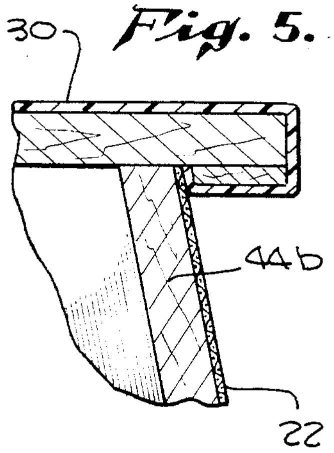
FIG. 5 is a fragmentary cross-sectional view taken in the circle 5 of FIG. 4.

The lower sections *44c*, *44d* of the front wall 44 are exactly perpendicular, see FIG. 4. Hence they are also exactly square in shape. This is not true of upper sections *44a*, *44b*. The upper sections are inclined rearwardly at an angle of about 10 degrees to the vertical. They are therefore square at both of their outside corners, but their inside corners are not square. Specifically, the lower inside corner of each upper wall section has an included angle of somewhat less than 90 degrees while the upper inside corner has an included angle of somewhat more than 90 degrees.

Each of the four sections of front wall 44 has a central opening therein for mounting a corresponding one of the speakers. These openings are indicated by dotted lines in FIG. 3. The openings are arranged in symmetrical vertical and horizontal rows.

Each of the speakers 14, 16, 18, 20 is attached flat against the rearward surface of the corresponding section of front wall 44. It will therefore be seen that the speakers are also arranged in symmetrical vertical and horizontal rows. Thus, the lower speakers 18, 20 point their sound in a horizontal outward direction away from the front of cabinet 12, but their outputs are not parallel, and instead diverge by an angle of about 20 degrees.

In similar fashion, the outputs of upper speakers 14, 16 diverge in a horizontal plane by an angle $\theta$ of about 20 degrees. They are not, however, pointed horizontally outwardly from the front of the cabinet, but instead are inclined upwardly at an angle $\alpha$ of about 10 degrees above the horizontal.

In a typical embodiment of the invention all four of the speakers may receive parallel inputs without any frequency cross-over network. Thus as shown in FIG. 2 driving power is provided through a pair of rear terminals 50 to a connection box 52, FIG. 4, from which individual wire pairs 54 carry the signal to the respective speakers.

All of the speakers may, for example, be mid-range speakers, such as the 12-inch Model EVM12 speakers made by Electro-Voice. Each compartment in the bottom half of the cabinet may have a volume of 2.5 cubic feet while each compartment in the top half has a volume of 1.8 cubic feet. Each speaker when hung in free air would have its strongest output at about 55 Hertz, but when supported inside its compartment each speaker has a broader frequency range. Thus the maximum output may be at a frequency of about 200 Hertz, with essentially a flat response to 500 Hertz, and the low roll-off frequency with a three decibel loss occurring at about 75 Hertz.

AN ARRAY OF SPEAKER UNITS

Figure 7:
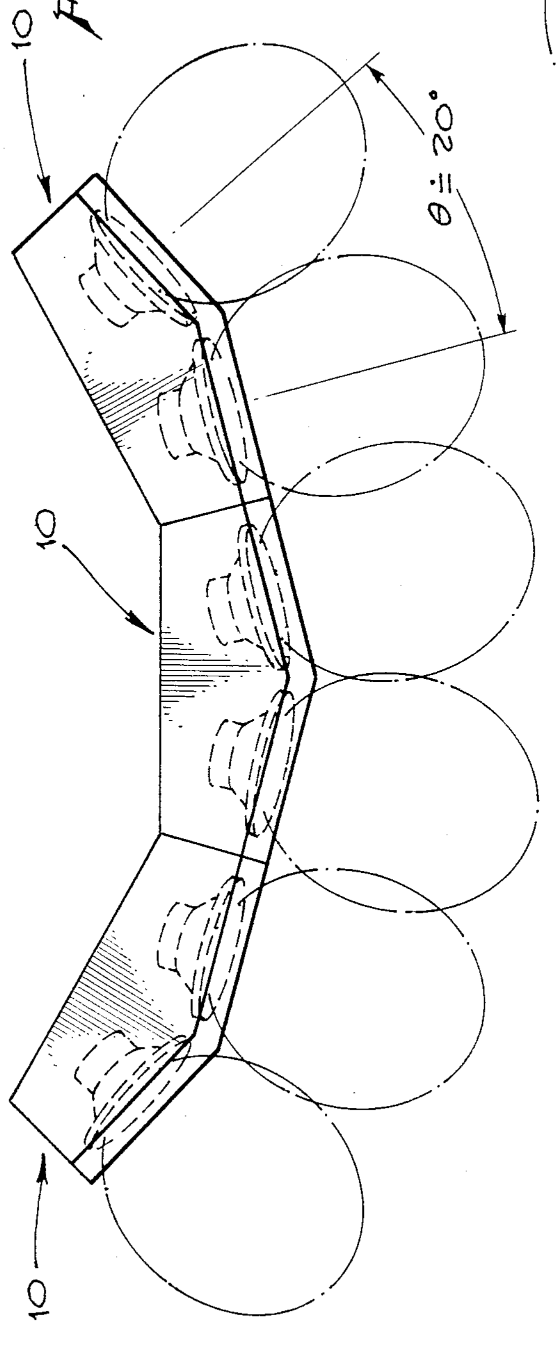
FIG. 7 is a top plan view of an array of speaker cabinets which are arranged in an arcuate configuration in accordance with the invention, the upper layers of speakers and their sound generation patterns being indicated by dotted lines.
Figure 8:
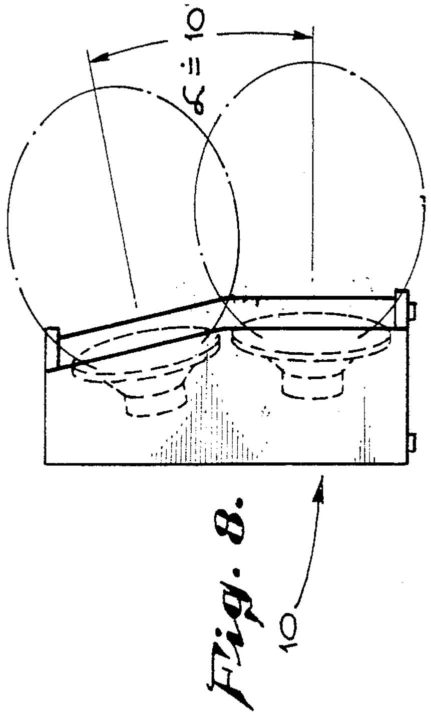
FIG. 8 is a side elevation view of one speaker cabinet in accordance with the invention, with the upper and lower speakers on one side of the cabinet being indicated by dotted lines together with their sound generation patterns.

FIG. 7 is a top plan view which shows the sound output pattern of an array of speaker units in accordance with the invention. Tapered side walls of adjacent units are placed in abutting relation. The sound outputs of adjacent units are therefore directed in differing directions in the horizontal plane.

FIG. 9 is a top plan view of a generalized form of speaker array according to the invention. Each speaker cabinet 12' has side walls inclined at an angle of somewhat less than 90 degrees to its front face, so that all speakers of the entire array lie in an entirely arcuate pattern. As shown by dotted lines and arrows, the sound from all of the speaker cabinets appears to originate from a common point of origin O. While not specifically shown in FIG. 9, the speaker cabinets used in this arrangement preferably have only two speakers, one upper and one lower. FIG. 9 therefore represents the sound dissemination pattern of the lower layer of speakers, and also the sound dissemination pattern of the upper layer of speakers, even though the sound dissemination patterns of the two layers of speakers are separated by a small angle in the vertical plane.

The invention has been described in considerable detail in order to comply with the patent laws by providing a full public disclosure of at least one of its forms. However, such detailed description is not intended in any way to limit the broad features or principles of the invention, which are to be measured only in accordance with the following claims.

I claim:

1. A portable modular loudspeaker apparatus which is convenient to transport and to install, and which simplifies the task of obtaining an acoustically correct installation, comprising:

a speaker cabinet which contains at least two speakers which are in fixed locations inside the cabinet, and which have fixed output directions relative to the cabinet and to each other such that each speaker is pointed in a slightly different direction, a sound generation pattern of each speaker then overlaps a sound generation pattern of each adjacent speaker, and as the sound travels away from the location of the speaker cabinet the sound output of each individual speaker tends to diverge from the sound output of each other speaker;

said speaker cabinet having top and bottom walls which are tapered in a horizontal plane, and are narrower at a back than at a front thereof, so that two or more of such speaker cabinets may then be placed in side-to-side, mutually abutting relationship, to provide an array of speakers positioned in a generally arcuate pattern; and manual gripping means on an exterior surface of said cabinet to facilitate transport and installation, said manual gripping means being so positioned as not to interfere with the side-to-side abutting relationship of two adjacent cabinets.

2. The apparatus of claim 1 which includes two speakers in the same horizontal plane, but whose sound outputs diverge from each other in that horizontal plane.

3. The apparatus of claim 1 which includes two speakers in the same vertical plane, and whose sound outputs diverge from each other in that vertical plane.

4. A portable loudspeaker apparatus as claimed in claim 1 wherein said speaker cabinet contains two horizontal layers of speakers, the outputs of the lower layer of speakers being pointed in a generally horizontal direction and diverging from each other in a horizontal plane, the outputs of the upper layer of speakers being pointed upwardly at an angle of at least a few degrees above the horizontal and also diverging from each other in a horizontal plane.

5. The apparatus of claim 4 wherein said speaker cabinet is made of wood, and also includes a horizontal shelf and a vertical divider which divide the interior of said cabinet into four separate speaker compartments.

6. A portable loudspeaker apparatus as claimed in claim 4 wherein each exterior side wall of said speaker cabinet is provided with a recessed hand grip.

7. A portable loudspeaker apparatus as claimed in claim 4 wherein the speakers in said upper layer are vertically aligned above the respective speakers in the lower layer.

8. A portable loudspeaker apparatus as claimed in claim 1 wherein each exterior side wall of said speaker cabinet is provided with a recessed hand grip.

9. The apparatus of claim 1 wherein two such speaker cabinets, when assembled together in side-to-side abutting relationship, produce a sound output from each speaker cabinet which is directed essentially along one of a plurality of radius line which emanate from a single point.

10. A portable modular loudspeaker apparatus which is convenient to transport and to install for live performances, comprising:

a speaker cabinet made of wood, having flat horizontal top and bottom walls and vertical left and right side walls, each of the top and bottom walls having tapered side edges and being wider at a front edge than at a rear edge, each of the side walls being secured to corresponding side edges of the top and bottom walls and diverging outwardly toward a front of the cabinet by an angle of about 10 degrees, and the front edges of both the top and the bottom walls being tapered to a central apex such that each half of the front edges are perpendicular to corresponding side walls;

said speaker cabinet also having a front wall made of four separate sections including left and right lower sections and left and right upper sections, said lower sections being vertically disposed and secured in abutting and perpendicular relation both to said bottom wall and to respective side walls, said upper sections being sloped rearwardly at an angle of about 10 degrees to a vertical and being secured both to said top wall and to respective side walls, each of said front wall sections having a central opening therein;

a front sound baffle covering all of said openings;

a horizontal wooden shelf and a vertical wooden divider inside said speaker cabinet, dividing an interior thereof into four separate speaker compartments;

a back wall, at least a portion of which is removable, normally covering a back side of said cabinet;

four loudspeakers mounted on a rearward surface of respective sections of said front wall so as to direct sound outputs forwardly through respective ones of said openings, circuit means extending through said back wall and into the interior of said cabinet and connected to all of said speakers for providing driving power thereto, so that as sound travels away from the location of the speaker cabinet the sound output of each individual speaker tends to diverge from the sound output of each other speaker;

said bottom wall of said speaker cabinet being adapted to be removably positioned upon a flat supporting surface; and an exterior surface of each side wall of said speaker cabinet having a recessed hand grip for lifting and transporting said cabinet so that two or more of such speaker cabinets may then be placed in side-to-side, mutually abutting relationship to provide an array of speakers arranged in a generally arcuate pattern.

11. Apparatus as in claim 10 wherein all four of said loudspeakers are mid-range speakers and are driven in parallel.

* * * * *